(12) United States Patent
Chen

(10) Patent No.: US 7,723,144 B2
(45) Date of Patent: May 25, 2010

(54) METHOD AND SYSTEM FOR FLIP CHIP PACKAGING OF MICRO-MIRROR DEVICES

(75) Inventor: Dongmin Chen, Saratoga, CA (US)

(73) Assignee: Miradia Inc., Santa Clara, CA (US)

( * ) Notice: Subject to any disclaimer, the term of this patent is extended or adjusted under 35 U.S.C. 154(b) by 0 days.

(21) Appl. No.: 12/039,550

(22) Filed: Feb. 28, 2008

(65) Prior Publication Data

US 2008/0211043 A1 Sep. 4, 2008

Related U.S. Application Data

(60) Provisional application No. 60/892,830, filed on Mar. 2, 2007.

(51) Int. Cl.
*H01L 21/00* (2006.01)
(52) U.S. Cl. ............... 438/50; 438/52; 257/E29.324
(58) Field of Classification Search ............... 438/50, 438/52
See application file for complete search history.

(56) References Cited

U.S. PATENT DOCUMENTS

| | | | |
|---|---|---|---|
| 4,422,233 A | 12/1983 | Habdas et al. | |
| 5,270,491 A | 12/1993 | Carnall, Jr. et al. | |
| 6,548,343 B1 | 4/2003 | Summerfelt et al. | |
| 6,777,767 B2 | 8/2004 | Badehi | |
| 6,856,014 B1 | 2/2005 | Ehmke et al. | |
| 7,053,488 B2 | 5/2006 | Yee | |
| 2004/0046248 A1* | 3/2004 | Waelti et al. | 257/712 |
| 2006/0049826 A1 | 3/2006 | Daneman et al. | |
| 2006/0065972 A1* | 3/2006 | Khan et al. | 257/712 |

OTHER PUBLICATIONS

International Search Report and Written Opinion of PCT Application No. PCT/US08/855335, dated Jul. 22, 2008, 10 pages total.

* cited by examiner

*Primary Examiner*—Wai-Sing Louie
(74) *Attorney, Agent, or Firm*—Townsend and Townsend and Crew LLP

(57) ABSTRACT

A package for a micro-electromechanical device includes a substrate adapted to support the micro-electromechanical device. The micro-electromechanical device is electrically coupled to a plurality of electrodes. The package also includes a thermally conductive structure coupled to the substrate, an electrical contact layer having a plurality of traces in electrical communication with the plurality of electrodes, and an interposer structure coupled to the substrate. The interposer structure includes a continuous annular region defining a recessed region bounded by a bond surface. The package further includes a transparent cover coupled to the interposer structure and sealing the micro-electromechanical device in the recessed region to isolate the micro-electromechanical device in a controlled environment.

12 Claims, 18 Drawing Sheets

METHOD AND SYSTEM FOR FLIP CHIP PACKAGING OF MICRO-MIRROR DEVICES

CROSS-REFERENCES TO RELATED APPLICATIONS

This application claims priority to U.S. Provisional Patent Application No. 60/892,830, filed on Mar. 2, 2007, the disclosure of which is hereby incorporated by reference in its entirety for all purposes.

BACKGROUND OF THE INVENTION

This present invention relates generally to manufacturing objects. More particularly, the invention provides a method and system for wafer level flip chip packaging of micromirror devices. Embodiments of the present invention provide for chip-on-board packaging of micro-mirror devices in a hermetically sealed package. Merely by way of example, the invention has been applied to a micro-mirror array in a hermetically sealed package with a transparent glass cover. The method and structure can be applied to other display technology as well as, for example, charge coupled display camera arrays, and infrared arrays.

The packaging of silicon integrated circuits has reached a high level of maturity. However, conventional packages in which an integrated circuit device is encapsulated in a plastic encapsulant present several drawbacks in applications that require more than electrical operation of the silicon integrated circuit. An example of such an application is optical illumination and reflection off an array of micro-mirrors or other micro-electromechanical systems (MEMS) structure. For example, these applications typically require the ability to illuminate the top of the silicon integrated circuit with optical energy and subsequently reflect the optical energy off the top of the silicon integrated circuit with high efficiency. The optical properties of plastic encapsulants utilized in conventional packages, including lack of transparency, non-uniformity of the index of refraction, and surface roughness make these packages unsuitable for this application.

Additionally, many MEMS often require an open space above the surface of the silicon integrated circuit to enable the micro-electro-mechanical structures to move in the direction parallel to the plane of the MEMS as well as in the direction perpendicular to the plane of the MEMS. The physical contact that the plastic encapsulant typically makes with the surface of the integrated circuit, therefore, make this package unsuitable for many MEMS applications. Thus, there is a need in the art for improved methods and systems for packaging of MEMS devices.

SUMMARY OF THE INVENTION

Embodiments of the present invention provide advanced chip-on-board packages for micro-mirror device arrays suitable for projection display applications.

According to an embodiment of the present invention, a package for a micro-electromechanical device is provided. The package includes a substrate adapted to support the micro-electromechanical device. The micro-electromechanical device is electrically coupled to a plurality of electrodes. The package also includes a thermally conductive structure coupled to the substrate, an electrical contact layer having a plurality of traces in electrical communication with the plurality of electrodes, and an interposer structure coupled to the substrate. The interposer structure includes a continuous annular region defining a recessed region bounded by a bond surface. The package also includes a transparent cover coupled to the interposer structure and sealing the microelectromechanical device in the recessed region to isolate the micro-electromechanical device in a controlled environment.

According to another embodiment of the present invention, a method of fabricating a package for an array of micromirror devices is provided. The method includes bonding an interposer structure to a first side of a substrate including the array of micro-mirror devices. A plurality of micro-mirrors in the array of micro-mirror devices are in electrical communication with a plurality of electrodes. The method also includes bonding a transparent cover to the interposer structure to form a controlled environment for the array of micromirror devices and forming a thermally conductive structure coupled to a second side of the substrate. The method further includes forming an electrical contact structure in electrical communication with the plurality of electrodes.

According to a particular embodiment of the present invention, a package for a micro-electromechanical device is provided. The package includes a substrate adapted to support the micro-electromechanical device electrically coupled to a plurality of electrodes, a thermally conductive structure coupled to the substrate, and an electrical contact layer having a plurality of traces in electrical communication with the plurality of electrodes. The package also includes an interposer structure coupled to the substrate and a transparent cover coupled to the interposer structure.

Many benefits are achieved by way of the present invention over conventional techniques. For example, embodiments of the present invention provide methods and systems for chip-on-board assemblies with reduced or no bond wires. As a result, parasitic effects are reduced in comparison to conventional designs. Additionally, embodiments provide a small footprint, resulting in increased die counts, for example by up to or more than 25-30%. The ease of performing wafer level electrical and optical probing of devices is increased by providing easy access to solder balls in comparison with conventional designs, which may require the removal of material such as a glass strip prior to performing testing. Moreover, reliability is increased and cost is reduced. Depending upon the embodiment, one or more of these benefits, as well as other benefits, may be achieved. These and other benefits will be described in more detail throughout the present specification and more particularly below in conjunction with the following drawings.

DETAILED DESCRIPTION OF SPECIFIC EMBODIMENTS

Figure 1:
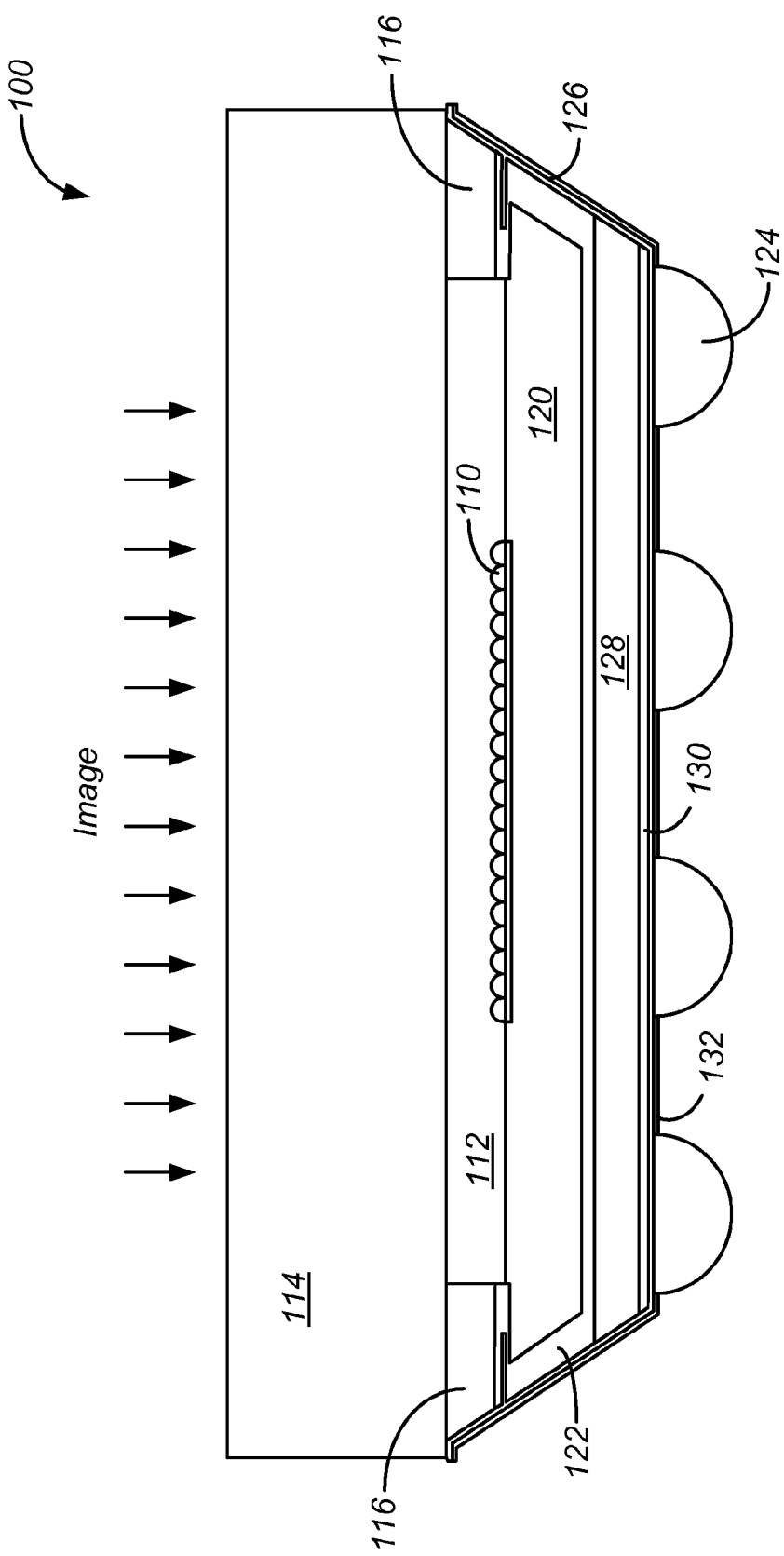
FIG. 1 is a simplified schematic illustration of a package for an imaging device according to an embodiment of the present invention.

FIG. 1 is a simplified schematic illustration of a package for an imaging device. As illustrated in FIG. 1, a package 100 is provided that is produced using a process that is applicable to CMOS imaging applications. As such, an imaging area with a micro-lens 110 is provided in the cavity 112 below the glass cover 114. Generally, the cavity wall 116 provides a non-hermetic seal for the sensor cavity as appropriate to imaging applications. Additionally, the cavity walls 116 in the design illustrated in FIG. 1 are generally too short for display and projection device applications, in which a taller wall is needed so that particles on the surface of the glass cover or defects in the glass cover will not be projected onto the display screen.

The glass layer 128 positioned below the silicon layer 120 supporting the imaging device 110 is characterized by a limited thermal conductivity. Although such a design is suitable for imaging applications, it may not be suitable for projection display applications in which much higher light intensity in the cavity area is present. Moreover, the epoxy 122 used to seal the package is generally not optimized in regard to thermal considerations, which differ from application to application as discussed above. The routing of electrical connections between the device in the cavity and the solder balls 124 on the back of the package is done with a single layer trace 126 that can only support a small number of electrical contacts. Thus, the ability of the package illustrated in FIG. 1 to support a large number of contacts is limited. One or more passivation layers 130 are provided under the glass layer 128 and above the metal traces 126. Additionally, one or more electrical insulating layers are formed on the lower surface of the metal traces 126 to provide for electrical isolation between the solder balls 124 of the BGA.

Figure 2:
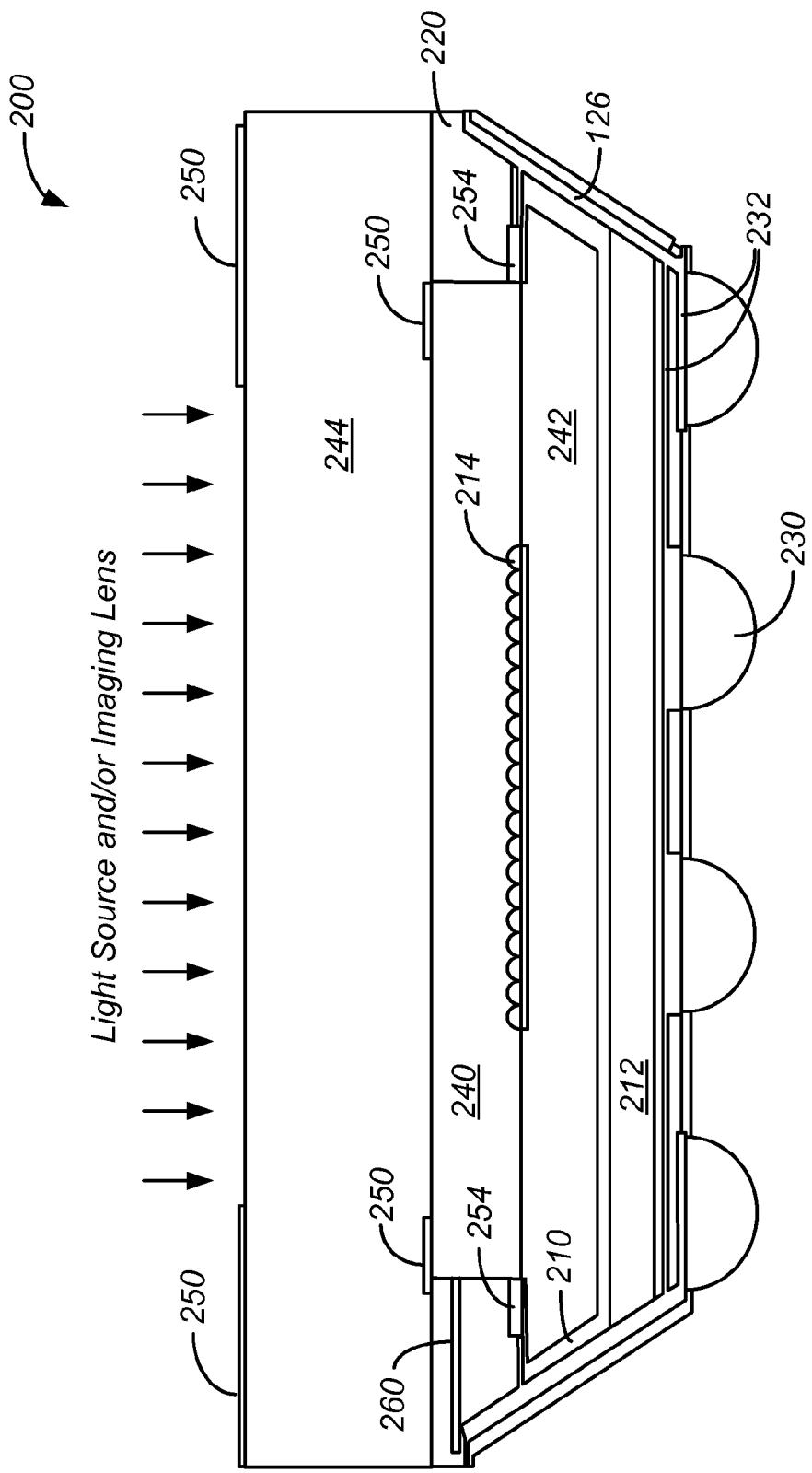
FIG. 2 is a simplified schematic illustration of a package for a micro-mirror device according to an embodiment of the present invention.

FIG. 2 is a simplified schematic illustration of a package 200 for a micro-mirror device according to an embodiment of the present invention. The package incorporates a number of features the provide benefits not available using conventional designs. For example, embodiments of the present invention utilize a thermally conductive epoxy 210 and thermally conductive dielectric layer 212 to accommodate the large heat loads associated with a light source of a projection display system and internal driver circuitry for an micro-mirror array 214. The thicknesses, geometry, and other design parameters are set at predetermined values as appropriate to the particular application.

Additionally, an interposer wafer 220 is used to increase the cavity wall height as appropriate for projection device application. Although not illustrated in FIG. 2, wafer level packaging is performed and then singulation or other separation processes are utilized to fabricate the package illustrated in FIG. 2. Thus, the cavity wall interposer 220 is initially a wafer level structure according to embodiments of the present invention.

A multi layer wire trace 232 is used as illustrated in FIG. 2 to increase the solder ball 230 density and thereby accommodate a larger pin count useful in display devices in comparison to imaging applications. Although only two layers are illustrated in FIG. 2, additional layers are provided in other package designs as appropriate to the particular application. One of ordinary skill in the art would recognize many variations, modifications, and alternatives.

The micro-mirror device array (MMD) 214 is sealed in the cavity 240 formed by the silicon support structure 242, the cavity wall interposer 220 and the glass cover 244 by a hermetic (glass frit, eutectic, covalent bonding, and the like) packaging method in some embodiments. Other packages are provided with a quasi-hermetic (low out-gassing epoxy, liquid crystal based polymers, and the like) package. Depending on the application, either hermetic, quasi-hermetic, or non-hermetic packages are provided. The hermetic, quasi-hermetic, or non-hermetic seal 254 is illustrated in FIG. 2. The hermetic or quasi-hermetic seal ensures a controlled chemical environment inside the sealed cavity for the duration of the product life. Additional discussion of the controlled environment provided by embodiments of the present invention are provided throughout the present specification and more particularly below.

In order to provide a spatial aperture for the package and MMD, a black chrome aperture 250 is formed on one or more surfaces of the glass member 244, which may include antireflection coatings. Other materials suitable to provide a varying reflectivity as a function of position are included in other embodiments. Utilizing such an aperture, the undesired stray light reflected from the structure and package is reduced, improving contrast ratio in display applications. In FIG. 2, the black chrome aperture is illustrated on a top and bottom surface of the glass member. In other packages, the aperture may be provided at internal layers of the glass material or on a single surface. One of ordinary skill in the art would recognize many variations, modifications, and alternatives.

One or more micro-fluidic channels 260 are provided in the cavity wall interposers 220 in order to enable gases or fluids to be passed from a location external to the cavity into the cavity 240. As an example, lubricants may be inserted into the cavity to reduce stiction problems associated with micro-mirrors in the illustrated array. The dimensions of the channel, valving including one-way valves, flow controllers, and the like are selected to provide for inflow or outflow as a function of time or other conditions such as cavity temperature. Although the micro-fluidic channels are illustrated in the interposer, they may be provided at other locations in addition to or as a replacement for the illustrated channels. In other embodiments where the microchannel is absent, lubrication materials and/or a getter material may be dispensed inside the cavity before the cavity is sealed. As described in relation to the process flow that follows, a partial dicing process may be used to allow wafer level probing of individual devices. Thus, embodiments of the present invention provide for enhanced test and evaluation processes.

Figure 3A:
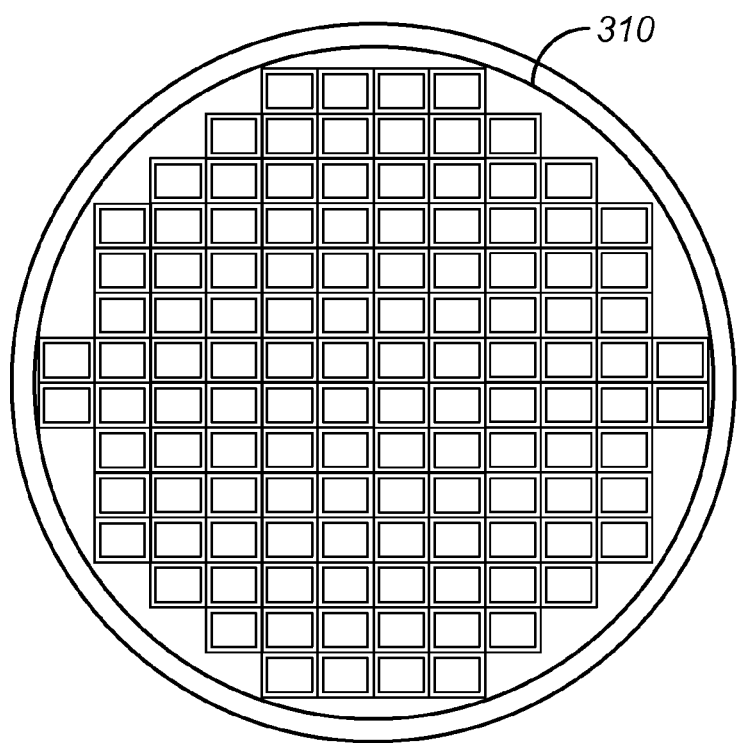
FIGS. 3A and 3B are top views of wafer level packaging layouts according to embodiments of the present invention.
Figure 3B:
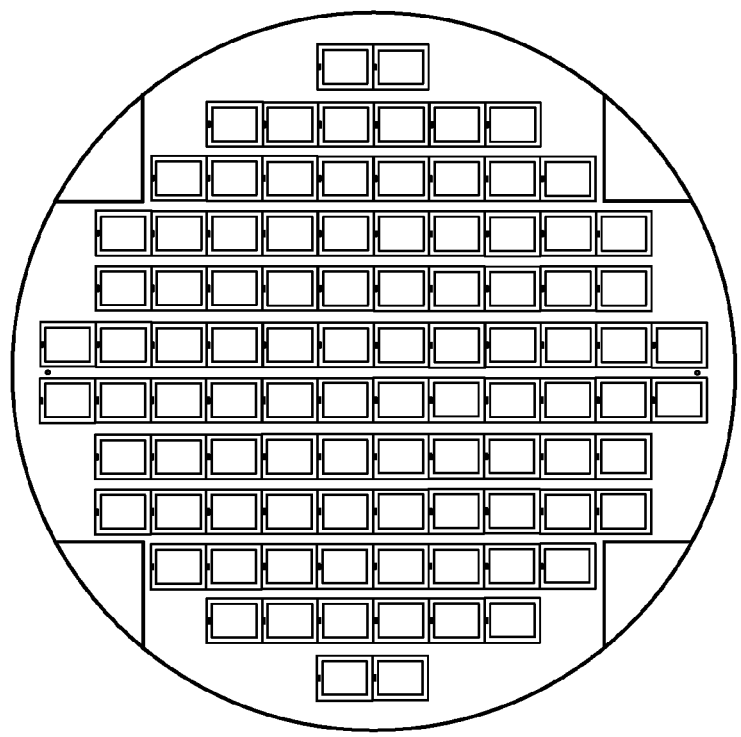

FIGS. 3A and 3B are top views of wafer level packaging layouts according to embodiments of the present invention. The layout illustrated in FIG. 3A provides a cell count of 120 while the layout illustrated in FIG. 3B provides a cell count of 96. An exclusion zone 310 is provide around the periphery of the layout illustrated in FIG. 3A. The small footprint provided by packages fabricated as described herein provides for increase packaging density, increasing device yield per wafer and reducing package costs. As an example, the horizontal pitch (center to center spacing between dies is approximately 15 mm and the vertical pitch is approximately 12.6 mm in an embodiment. The dicing trace is illustrated at 0.10 mm (100 μm) in an embodiment. Of course, other particular values are utilized in other embodiments depending on the particular applications.

Figure 14:
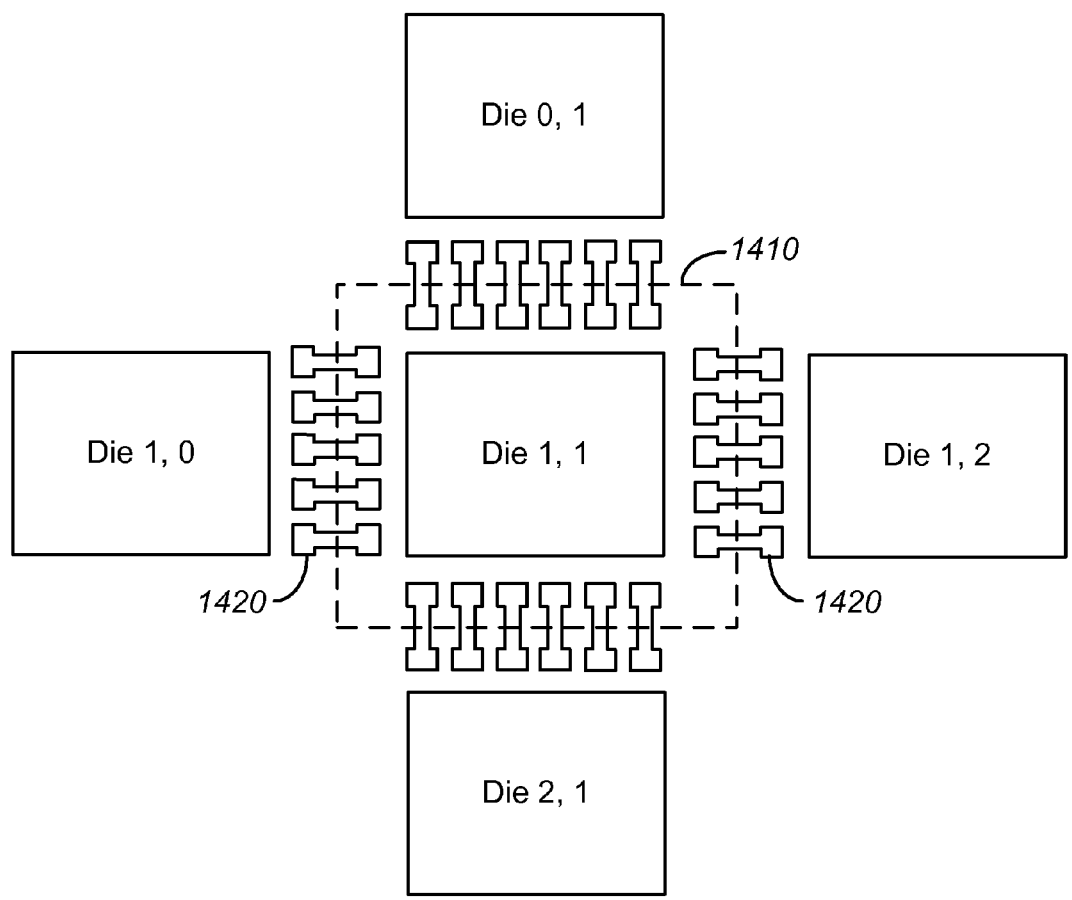
FIG. 14 is a simplified top-view illustration of a packaging layout for a number of dies according to an embodiment of the present invention.

FIG. 14 is a simplified top-view illustration of a packaging layout for a number of dies according to an embodiment of the present invention. As illustrated in FIG. 14, a number of dies (e.g., five dies) are provided on a substrate (not shown). The dies, which are labeled by row and column for ease of description, are arrayed on the substrate in a two-dimensional grid as appropriate to the particular device dimensions and the like. The dashed lines 1410 illustrated in FIG. 14 illustrate the dimensions of the package formed using embodiments of the present invention. Bond pads and the interposer wafer geometry 1420 are illustrated between the various dies although the number and layout is merely exemplary. The dashed lines 1410 shown in FIG. 14 are also illustrated in the figures that follow.

FIGS. 4-11B are simplified process flows for packaging a micro-mirror device according to an embodiment of the present invention. Although these figures illustrate the packaging of a single or two devices, it is understood that wafer level packaging of devices is provided and these figures and their description is provided in view of this understanding. One of ordinary skill in the art would recognize many variations, modifications, and alternatives.

Figure 4:
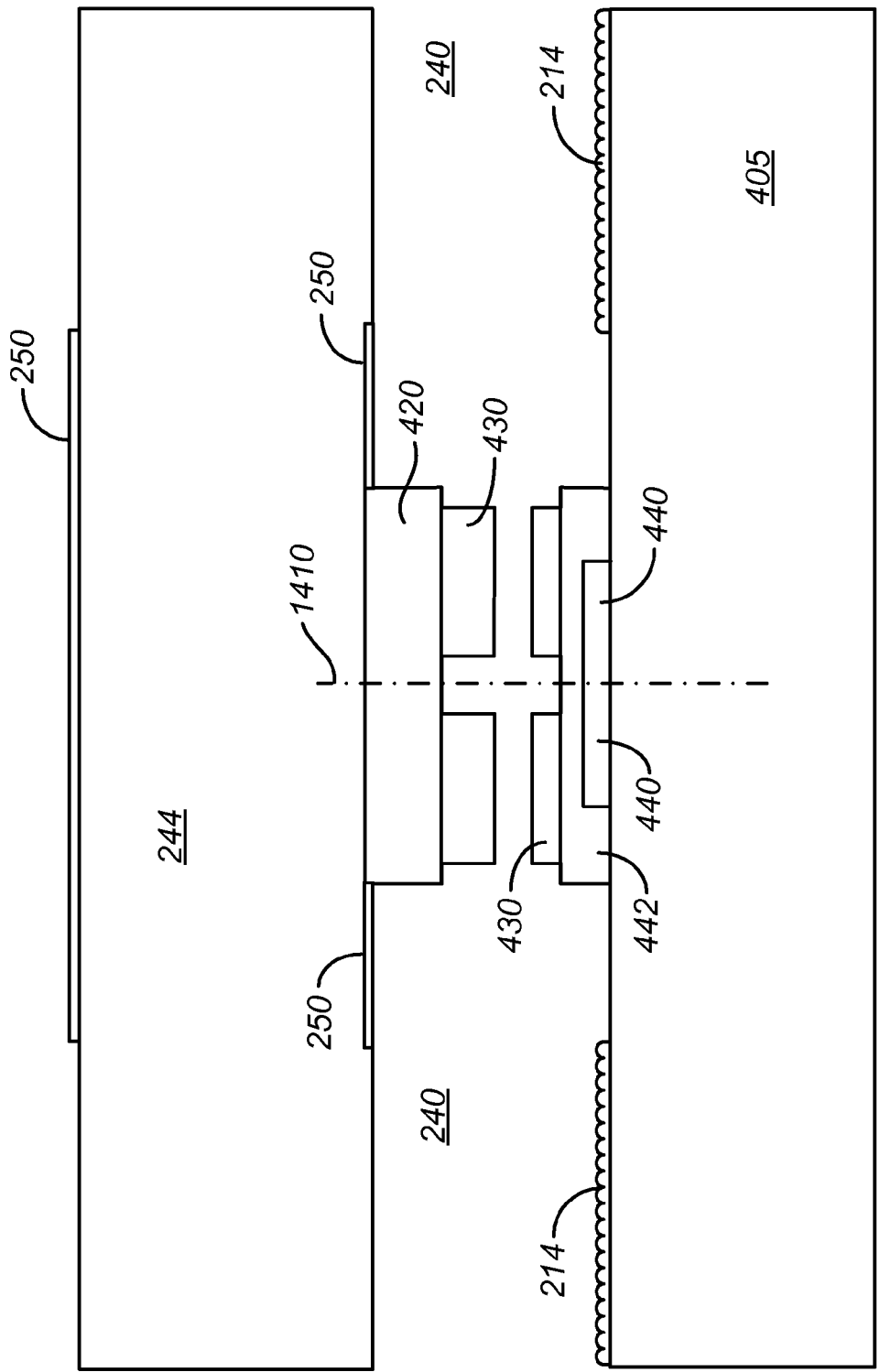
FIGS. 4-11B are simplified process flows for packaging a micro-mirror device according to an embodiment of the present invention

FIG. 4 illustrates the formation of an adhesion layer on the bonding surfaces of the interposer wafer 420 and the device wafer 405 (e.g., a CMOS/MEMS wafer). In a first embodiment of the present invention, a glass frit layer 430 is printed onto the bonding surfaces of the wafers. As an example, the glass frit may be printed onto the bonding surfaces using a screen printing process or other suitable printing process. The glass frit, which usually consists of either a lead glass or a lead silicate glass that is finely ground and then combined with an organic solvent or binder, is characterized by the consistency of a paste. As discussed in relation to FIG. 12, after printing of the glass frit, the organic solvent is removed or burned out using a thermal process. The organic burn out process provides a glazed glass frit layer that is suitable for storage and later wafer scale bonding operations. Additional details related to glass frit printing, organic burn out, and glazing are provided in co-pending and commonly assigned U.S. patent application Ser. No. 11/187,421, filed on Jul. 22, 2005, the disclosure of which is hereby incorporated by reference in its entirety. The bond pads 440 are covered by an oxide layer 442 in the embodiment illustrated in FIG. 4.

The use of the glass frit seal rings provides for a controlled environment in the cavity formed around the MEMS devices in subsequent processing steps. As an example, the controlled environment may be a hermetically sealed environment surrounding the MEMS devices. It should be noted that in conventional packages utilizing epoxy during bonding processes, outgassing from the epoxy results in a package in which the devices present on the dies are not sealed in a controlled environment. Rather, the epoxy is a source of gases (typically the solvents used in the epoxy) that, over time, will contaminate the environment surrounding the MEMS devices. Thus, embodiments of the present invention provide for benefits not achieved utilizing conventional epoxy-based packaging techniques, for example, the provision of a controlled environment in cavity 240.

Such a controlled environment provides for predictable device operation and long-life operation, which is a desirable design criteria in many applications. As additional examples, the controlled environment may be a vacuum environment, an ambient environment including one or more gases (e.g., inert gases, dry nitrogen, or the like), an environment including antistiction agents, or the like. Moreover, another exemplary controlled environment would be an environment in which the package is substantially impermeable to water, thus protecting the MEMS devices in cavity 240 from contact with water or other fluids.

In a second embodiment of the present invention, a metal layer 430 is formed on the bonding surface of the wafers. Exemplary metals suitable for applications included within the scope of embodiments of the present invention include gold/tin, indium/silver, or the like depending on the temperature requirements of the bonding process. Metal formation processes including plating, deposition, sputtering, and the like may be used to form a single or multi-layer metallization on the bonding surfaces. The metal layer provides suitable surfaces for eutectic bonding in subsequent steps. One of ordinary skill in the art would recognize many variations, modifications, and alternatives.

Figure 5:
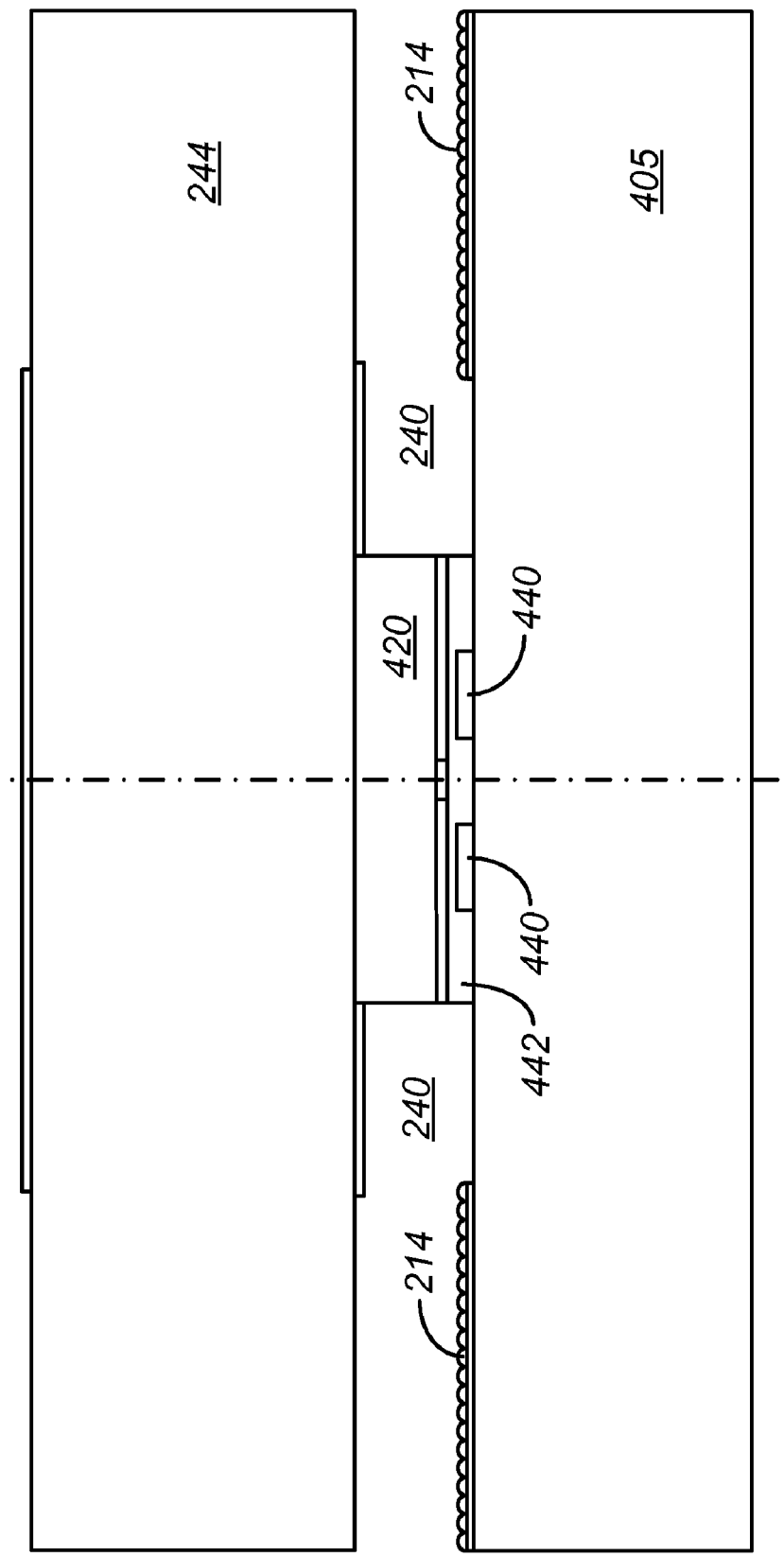

FIG. 5 illustrates bonding of the interposer wafer to the CMOS substrate including the micro-electromechanical (MEMS) devices such as micro-mirror device arrays. The bond interfaces may include one or more adhesion layers such as the illustrated oxide layer and the optional glass frit or metallization layers. Two MMD arrays 214 are illustrated on either side of a portion of the interposer wafer 420. The interposer is bonded to the glass cover member 244 as illustrated in FIG. 5, either prior to, after, or concurrently with bonding of the interposer wafer to the CMOS substrate 405. The CMOS substrate includes circuitry and interconnects not illustrated in FIG. 5 for purposes of clarity. Two bond pads 440 are illustrated to represent this circuitry. After bonding, a plurality of cavities 240 are formed between the CMOS wafer and the glass cover, with lateral definition provided by the interposer wafer. The interposer wafer and the glass cover may be in integral structure formed from a single piece of material or a composite structure as appropriate to the particular application.

In an embodiment, the micro-mechanical device is hermetically sealed or quasi-hermetically sealed from an external environment.

Figure 6:
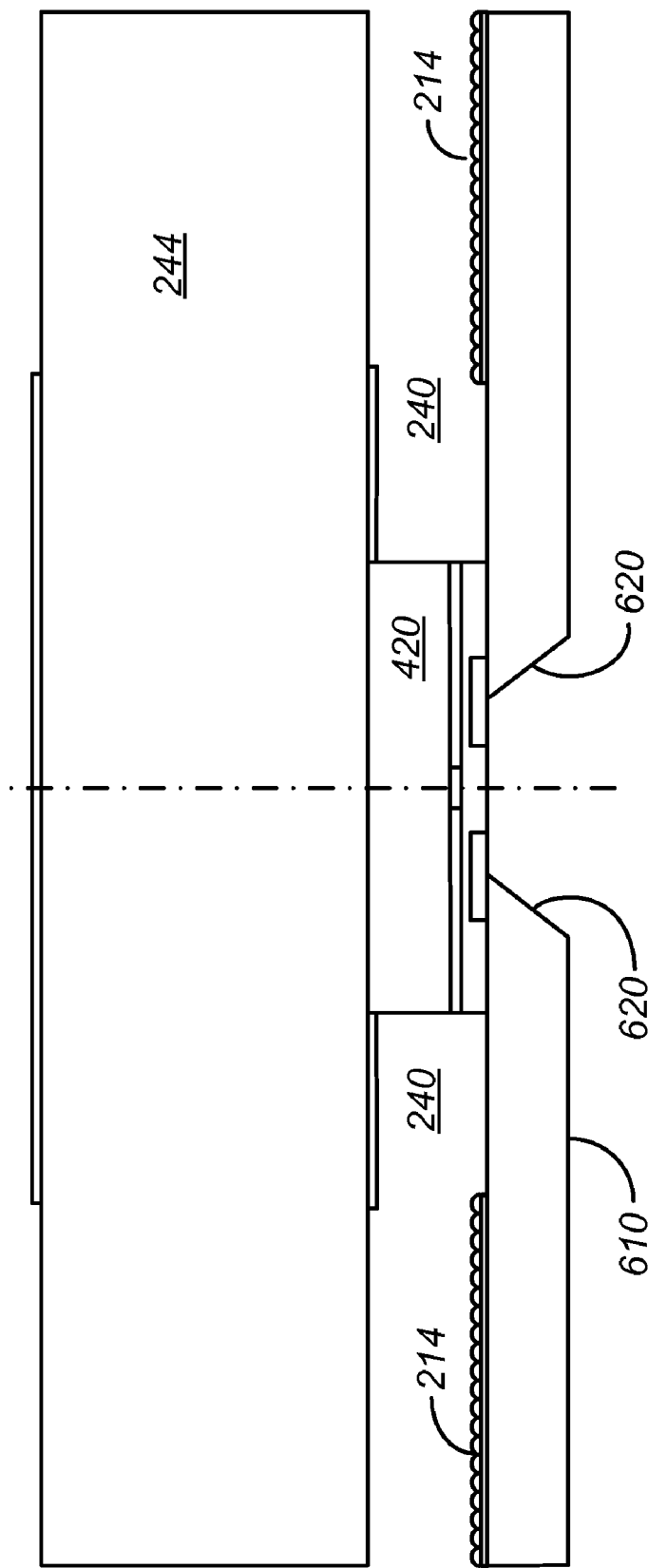

FIG. 6 illustrates thinning of the backside of the silicon CMOS wafer and etching of the silicon to expose the bond pads. Grinding, lapping, etching, or other thinning processes may be used to reduce the thickness of the silicon substrate, for example, to a reduced thickness of 130 µm. In other embodiments, other thicknesses are utilized as appropriate to the particular application. A chemical isotropic etching process is illustrated in FIG. 6 to expose the bond pads and create a scribe line, however embodiments of the present invention are not limited to such an etching process. Isotropic or other etching or material removal processes are included within the scope of embodiments of the present invention. A thinned (e.g., grinded) surface 610 and the etched surfaces 620 are illustrated in FIG. 6.

Figure 7:
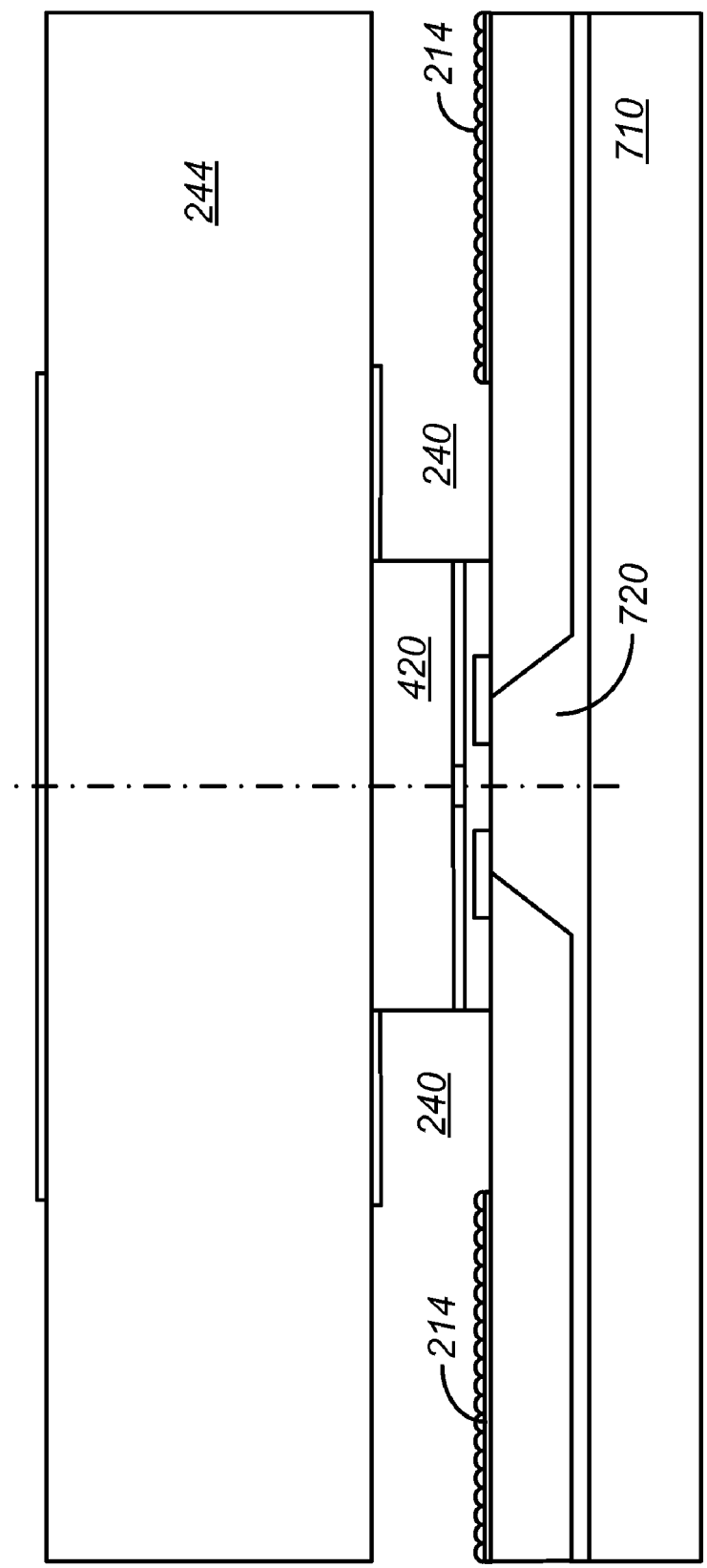
Figure 8:
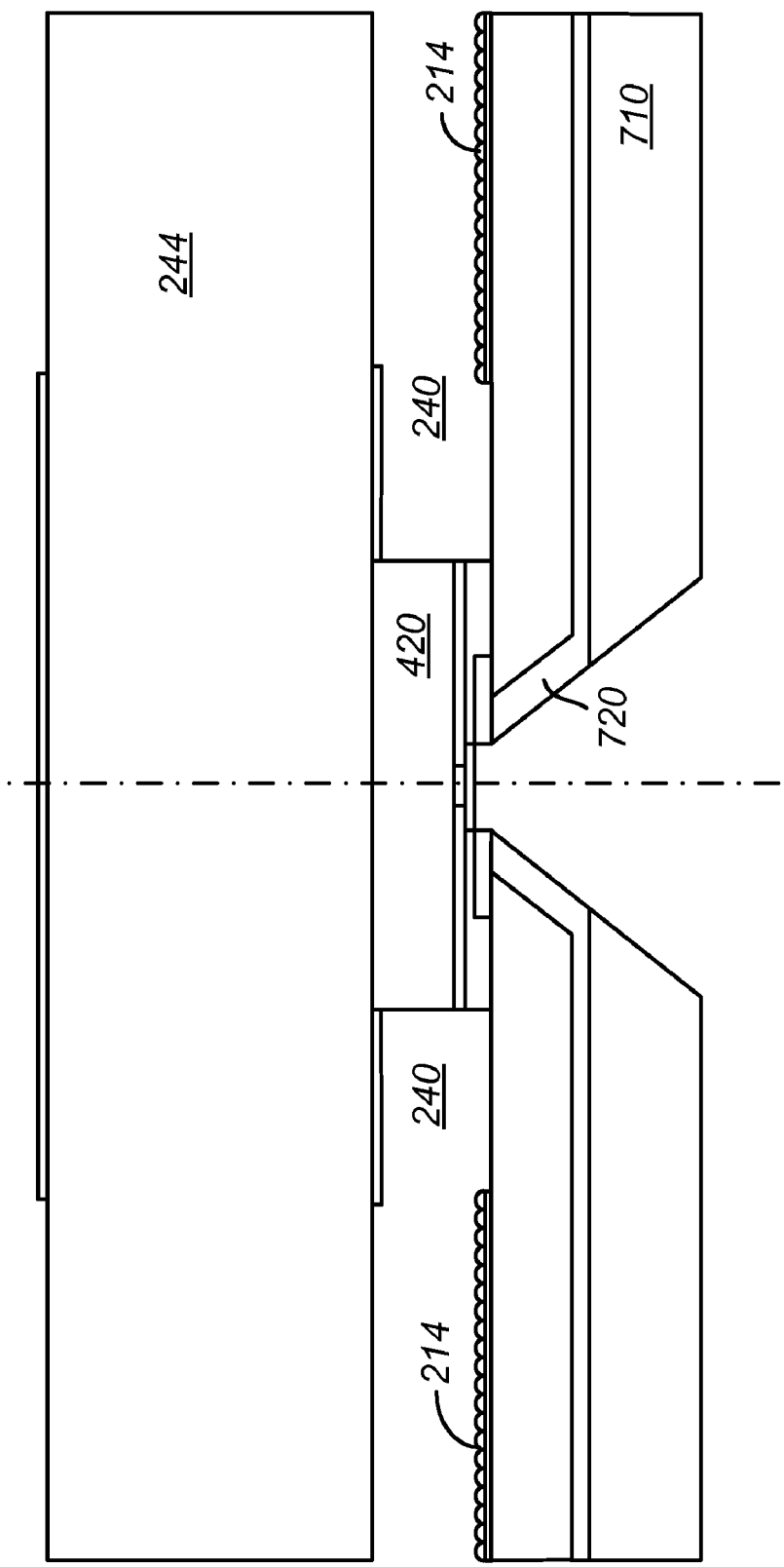

A thermal epoxy 720 and a dielectric layer 710 are formed on the CMOS substrate as illustrated in FIG. 7. As an example, the dielectric layer 710 is a glass formed by a spin-on glass formation process or other techniques. Bonding of a glass member is utilized in packages fabricated using other techniques. A notch is formed as illustrated in FIG. 8, exposing the electrical contact pads (C-pads) interconnected with the internal circuitry. An etching or other material removal technique is typically used to form the illustrated notch.

Figure 9:
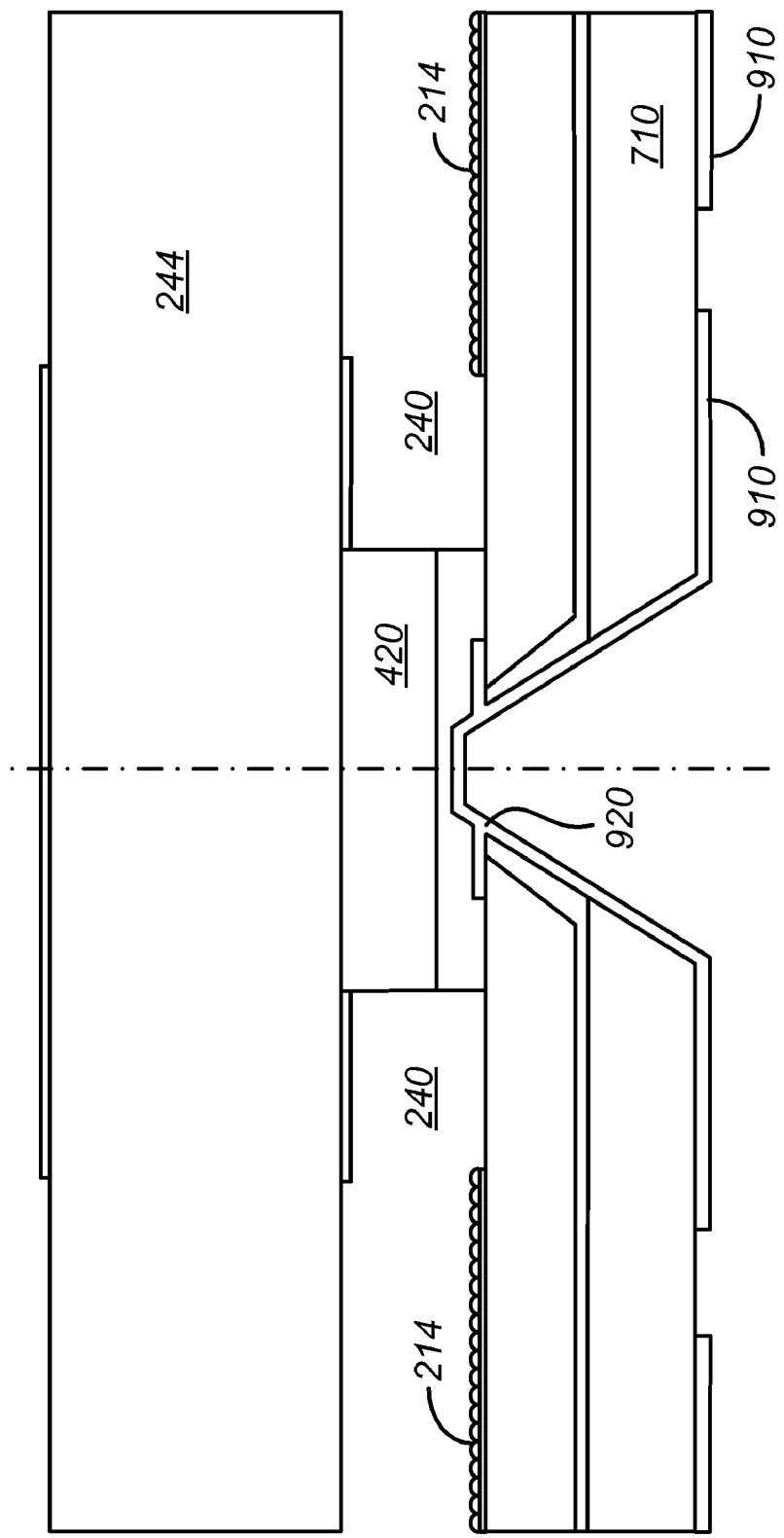
Figure 10:
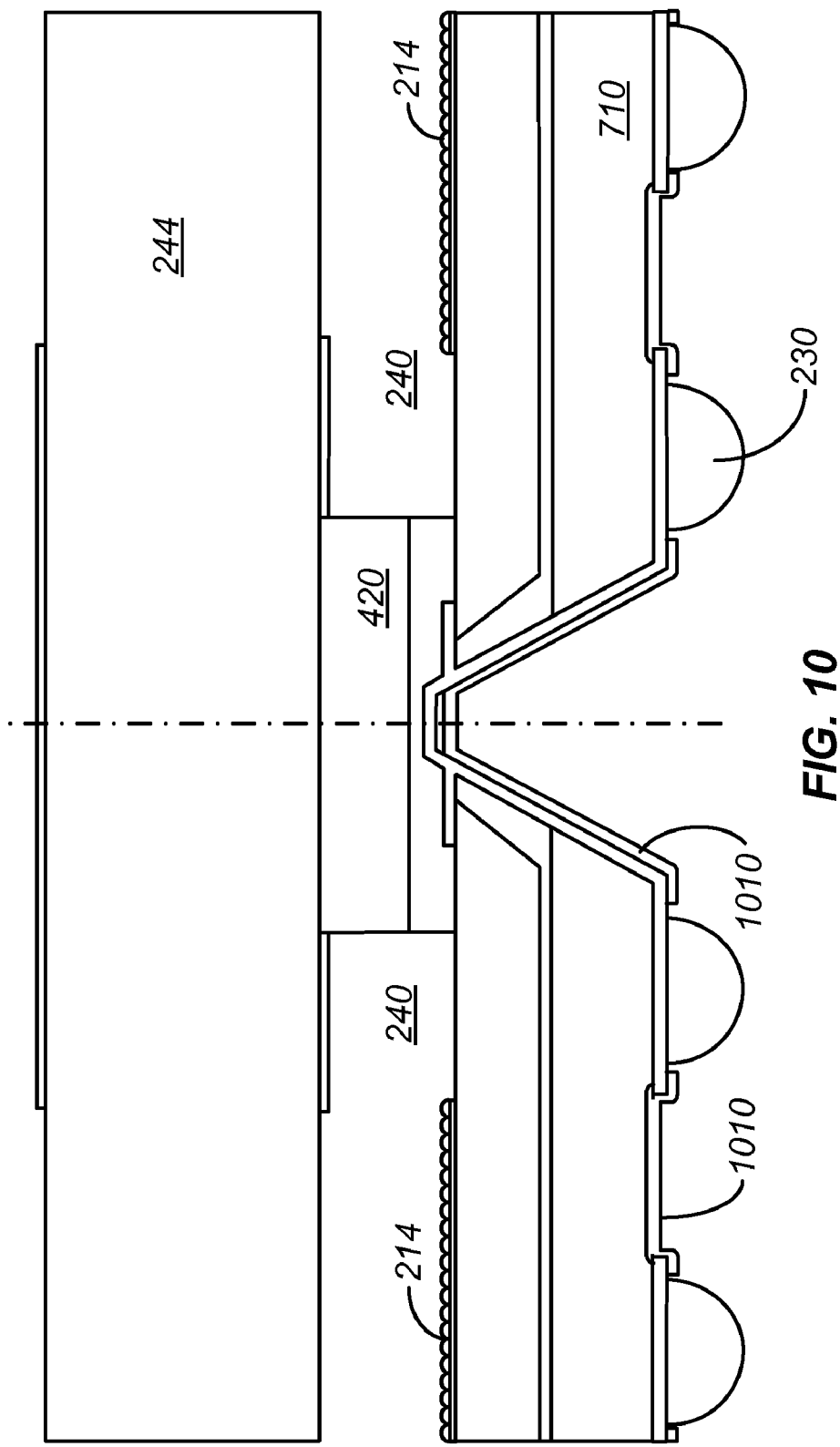

Electrical leads 910 are formed as illustrated in FIG. 9 using metal deposition and patterning, followed by electrical plating to achieve the desired metal thickness. A T-shaped contact 920 is made between the patterned electrical leads and the contact pads (C-pads). The leads are fabricated with a two-dimensional structure extending into the plane of the figure to provide for electrical contact to various portions of the device structure. Moreover, although not illustrated, multi-layer traces are provided on the back of the dielectric layer by embodiments of the present invention, providing for higher lead density routing than conventional designs. FIG. 10 illustrates BGA formation with eutectic solder bumps 230 in electrical communication with the multilayer electrical leads. A passivation layer 1010 is provided that may be fabricated from a variety of electrically insulating materials that provide sufficient mechanical stability.

Figure 11A:
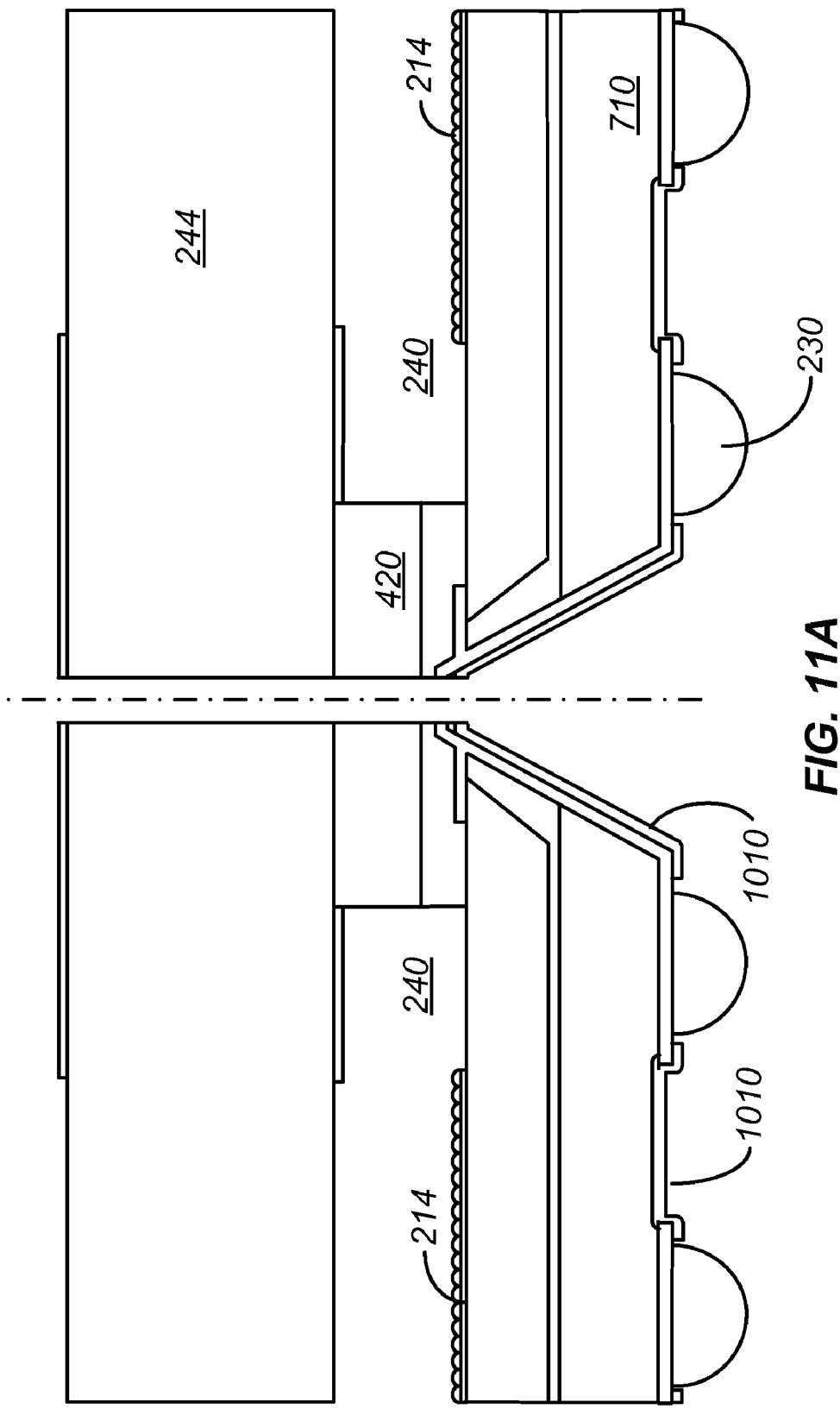
Figure 11B:
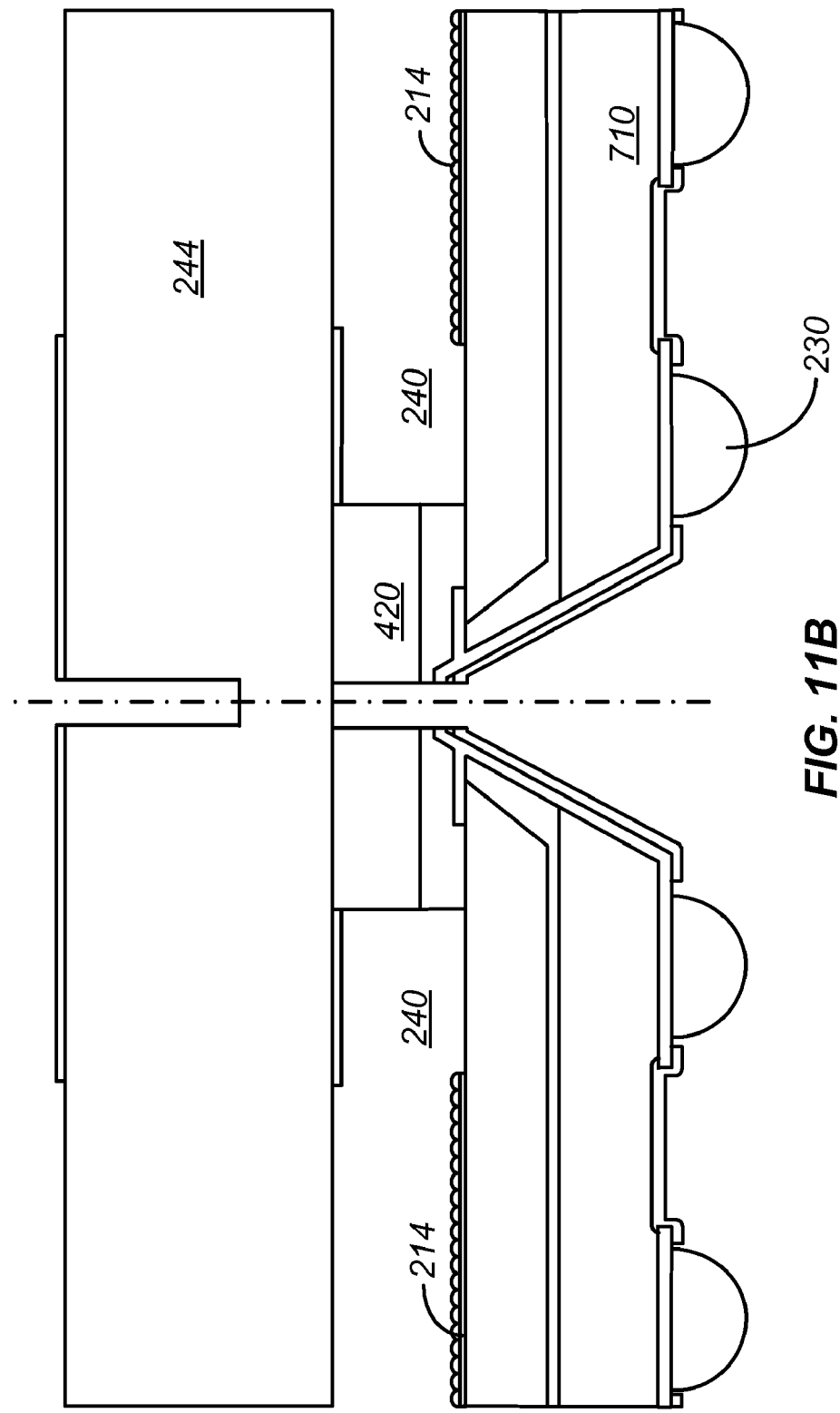

FIG. 11A illustrates dicing of packages that are to be used for chip level testing. FIG. 11B illustrates partial dicing of packages that are to be tested using an alternative wafer level probing method. Both methods are useful depending on the particular testing protocol. Processes that may be utilized in dicing or partially dicing packages include cutting using a wafer saw, etching, a scribe and break process, and the like. One of ordinary skill in the art would recognize many variations, modifications, and alternatives.

It should be appreciated that the specific steps illustrated in FIGS. 4-11B provide a particular method of packaging a micro-mirror device array according to an embodiment of the present invention. Other sequences of steps may also be performed according to alternative embodiments. For example, alternative embodiments of the present invention may perform the steps outlined above in a different order. Moreover, the individual steps illustrated in FIGS. 4-11B may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 12:
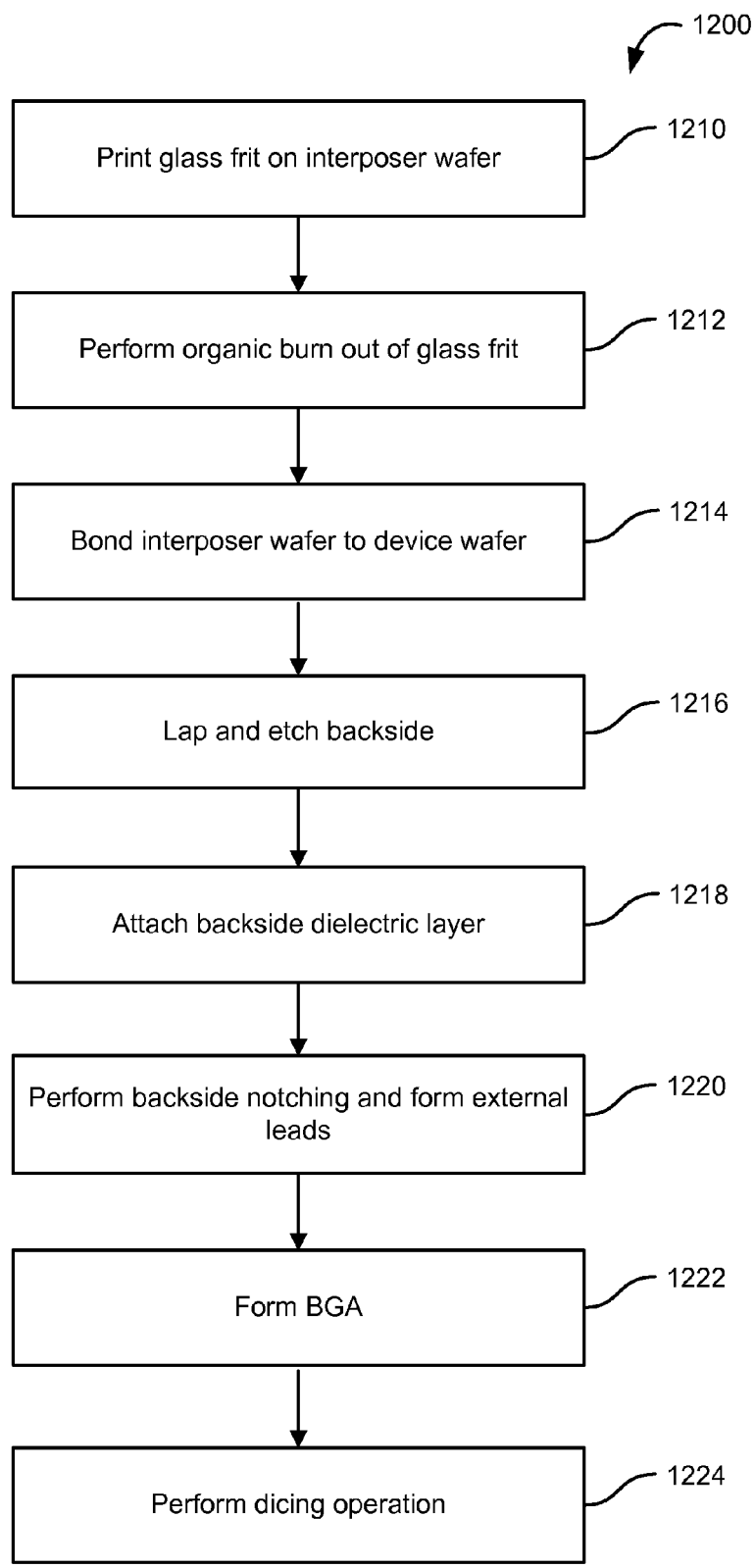
FIG. 12 is a simplified flowchart illustrating a process flow for fabrication of a package according to an embodiment of the present invention.

FIG. 12 is a simplified flowchart illustrating a process flow for fabrication of a package according to an embodiment of the present invention. The process flow 1200 includes printing a glass frit pattern on an interposer wafer (1200). The glass frit, which is generally applied as a paste is defined using a screen printing process in an embodiment in order to provide a layer of glass frit material in a predetermined pattern on the interposer wafer. As discussed previously, the glass frit is applied to the bonding surface of the interposer wafer. After printing of the glass frit material, an organic burn out process is performed (1212) to remove volatile organics from the glass frit material, thereby curing the glass frit material. In embodiments in which a controlled environment is provided inside the MEMS package, the burn out process enables the glass frit material to provide a bonding interface that is free from outgassing and other processes that would results in contamination of the MEMS package environment.

The interposer wafer is bonded to the device wafer (e.g., a CMOS/MEMS wafer) (1214) in order to seal the devices on the device wafer (e.g., micro-mirror arrays) in the controlled environment. After wafer bonding, the backside of the device wafer is lapped or thinned to reduce the thickness of the device wafer and selectively etched to form a scribe line (1216). As illustrated in FIG. 6, a grinding or other thinning process is utilized in combination with an etching process to decrease the thickness of the device wafer and remove a portion of the device wafer adjacent the bond pads.

A backside dielectric layer (e.g., a glass substrate) is attached to the backside of the device wafer using a thermal epoxy (1218). The thermal epoxy is separated from the dies by the interposer wafer, which is thus protected from contact with the thermal epoxy. Backside notching is performed and external leads are formed (1220) as illustrated in FIG. 9 and FIG. 10. The BGA is formed (1222) and dicing is performed (1224). The dicing can be used to either completely separate the dies as illustrated in FIG. 11A or to only partially separate the dies as illustrated in FIG. 11B.

It should be appreciated that the specific steps illustrated in FIG. 12 provide a particular method of fabricating a MEMS package according to an embodiment of the present invention. Other sequences of steps may also be performed according to alternative embodiments. For example, alternative embodiments of the present invention may perform the steps outlined above in a different order. Moreover, the individual steps illustrated in FIG. 12 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 13:
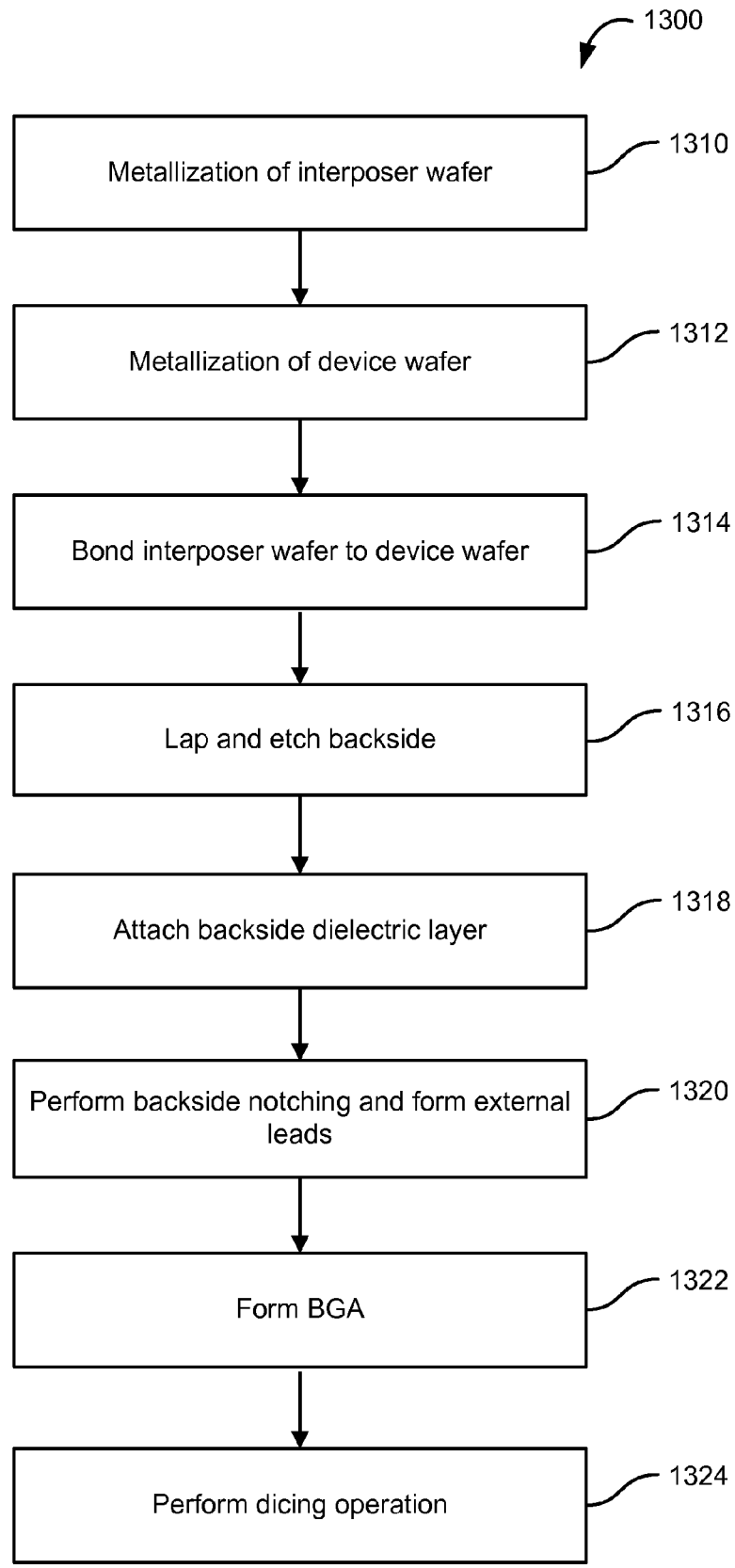
FIG. 13 is a simplified flowchart illustrating a process flow for fabrication of a package according to another embodiment of the present invention.

FIG. 13 is a simplified flowchart illustrating a process flow for fabrication of a package according to another embodiment of the present invention. Referring to FIG. 13, the illustrated process flow 1300 shares some common processes with the process flow illustrated in FIG. 12. Similar descriptions of common processes is not repeated here for purposes of conciseness. The interposer wafer is metalized (1310) to form an adhesion layer on the bonding surface of the interposer wafer. The device wafer is also metalized (1312) to form a corresponding adhesion layer on the bonding surface of the device wafer. The metallization of the wafers can be performed using deposition, plating, sputtering, or similar processes. The metal layer is formed using gold/tin, indium/silver or other suitable metal or alloy with a thickness of about 100 μm in a particular embodiment. The interposer wafer is bonded to the device wafer (e.g., a CMOS/MEMS wafer) (1314) in order to seal the devices on the device wafer (e.g., micro-mirror arrays) in the controlled environment. The following processes 1316-1324 are performed as described in relation to FIG. 12.

It should be appreciated that the specific steps illustrated in FIG. 13 provide a particular method of fabricating a MEMS package according to another embodiment of the present invention. Other sequences of steps may also be performed according to alternative embodiments. For example, alternative embodiments of the present invention may perform the steps outlined above in a different order. Moreover, the individual steps illustrated in FIG. 13 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 15A:
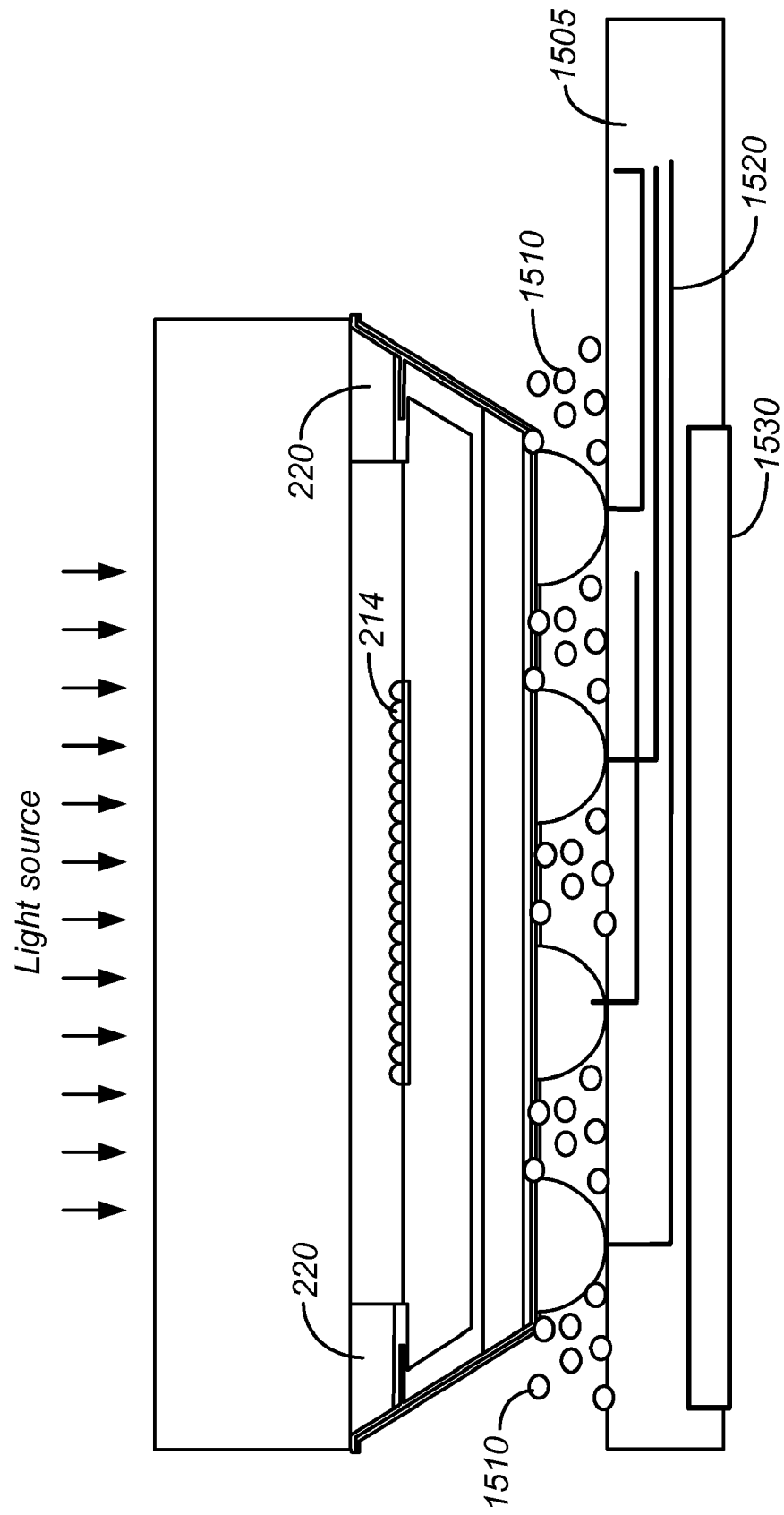
FIGS. 15A-C are simplified schematic illustrations of package assemblies according to embodiments of the present invention.
Figure 15B:
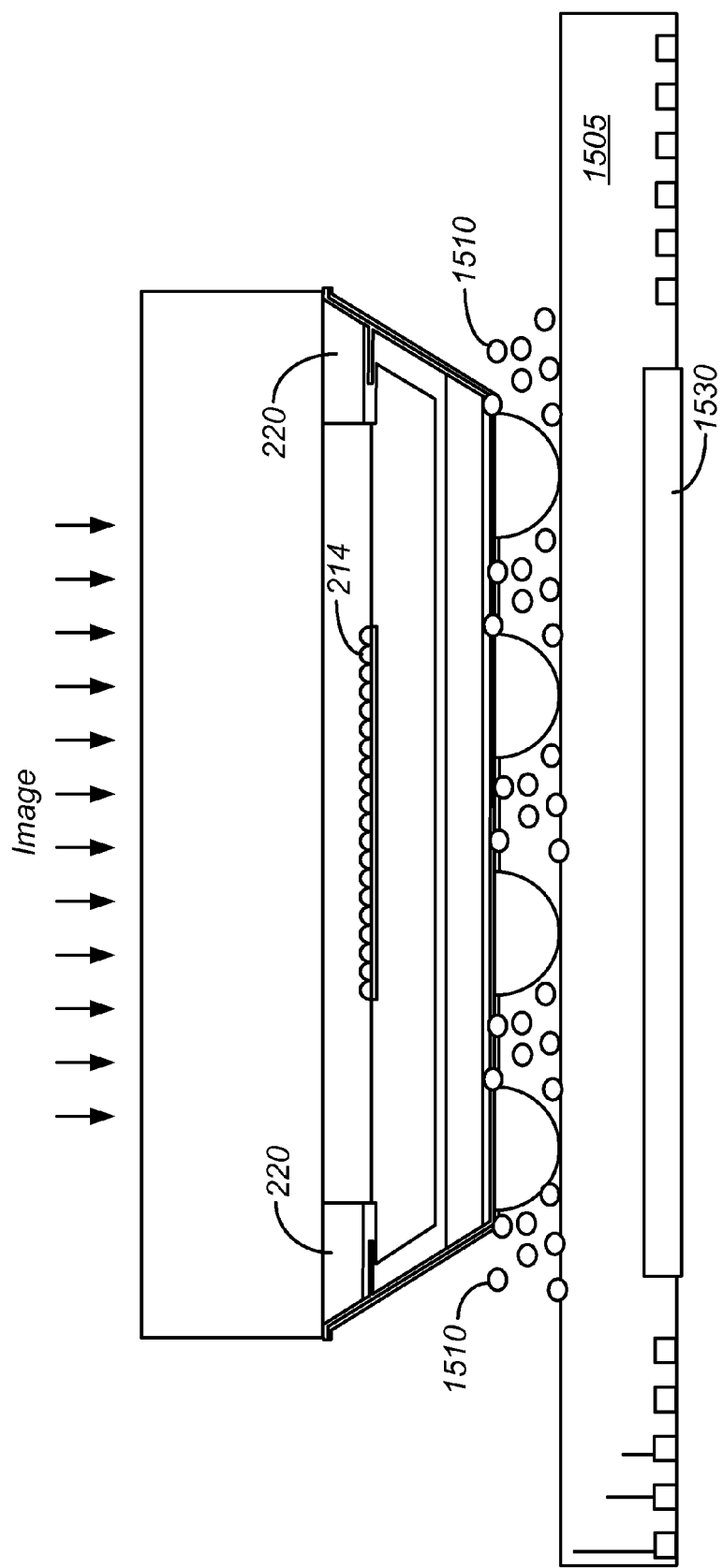
Figure 15C:
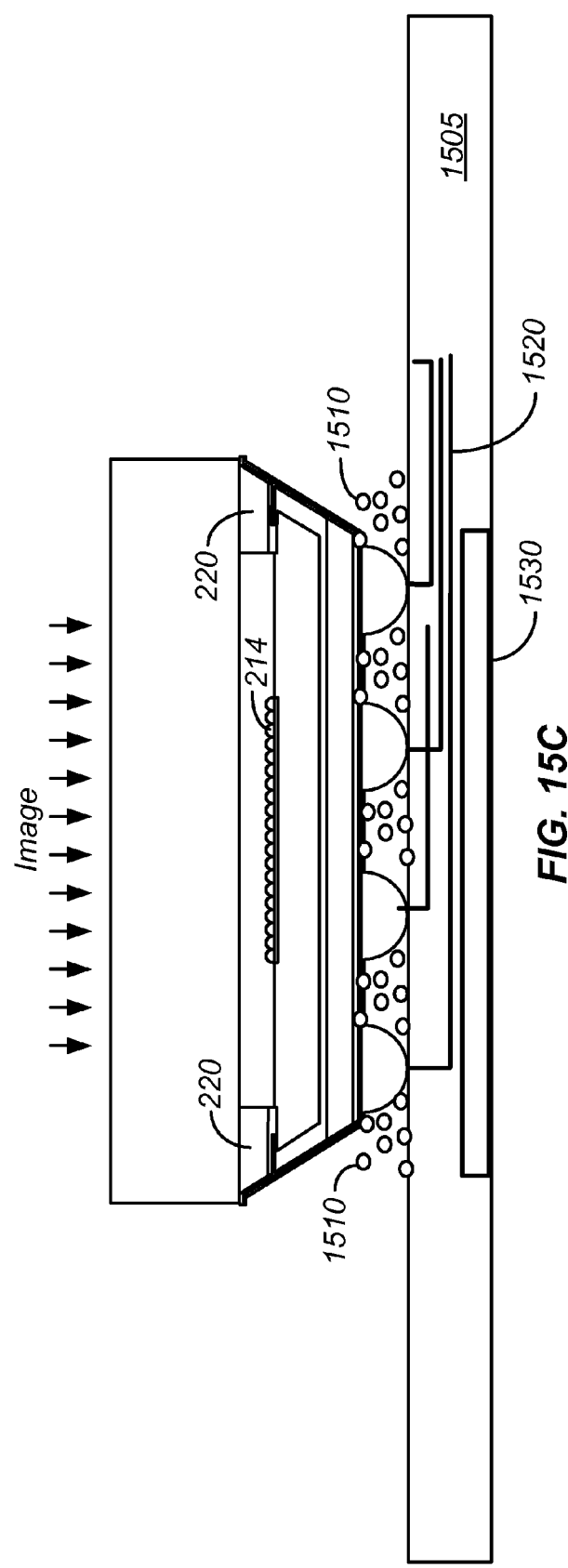

FIGS. 15A-C are simplified schematic illustrations of package assemblies according to embodiments of the present invention. The package illustrated in FIG. 15A is a flex-type assembly that includes a printed circuit board (PCB) 1505 having a number of wire traces 1520 formed therein that provide electrical connectivity to the BGA of the MEMS package. The PCB may be fabricated from ceramic materials, resins, and the like. A thermal compound 1510 is utilized to underfill the MEMS package and provide for thermal conductivity from the MEMS package to the PCB. In an embodiment, the thermal compound 1510 is electrically insulating. A heat conduction pad 1530 is provided on a lower surface of the PCB, further enhancing the thermal conductivity of the package assembly. In a particular embodiment, the heat conduction pad is fabricated from a thermally conducting epoxy, also referred to a filling compound although this is not required.

FIG. 15B is a simplified schematic illustration of a package assembly according to another embodiment of the present invention. The socket-type package assembly illustrated in FIG. 15B shares some characteristics with the flex-type assembly illustrated in FIG. 15A. A few of the common elements are the thermal compound underfilling the MEMS package and the heat conduction pad 1530. FIG. 15C is a simplified schematic illustration of a package assembly according to yet another embodiment of the present invention. The direct mount package assembly illustrated in FIG. 15C shares some characteristics with the flex-type assembly illustrated in FIG. 15A and the socket-type package assembly illustrated in FIG. 15B. The MEMS package is mounted directly on a PCB 1505 or other suitable substrate. The wire traces 1520 contained in the PCB provide electrical connectivity to the MEMS package and the heat conduction pad 1530 provide for enhanced thermal conductivity.

While the present invention has been described with respect to particular embodiments and specific examples thereof, it should be understood that other embodiments may fall within the spirit and scope of the invention. The scope of the invention should, therefore, be determined with reference to the appended claims along with their full scope of equivalents.

What is claimed is:

1. A package for a micro-electromechanical device, the package comprising:
   a substrate having an upper surface, a lower surface, a first side surface, and a second side surface of the substrate; the substrate adapted to support the micro-electromechanical device on the upper surface, the micro-electromechanical device being electrically coupled to a plurality of electrodes disposed on the upper surface of the substrate;
   a thermally conductive structure coupled to the lower surface of the substrate;
   a dielectric layer disposed adjacent to the thermally conductive structure, the dielectric layer having a first surface and a second surface, wherein a portion of the first surface of the dielectric layer is in contact with the thermally conductive structure;
   an electrical contact layer having a plurality of traces in electrical communication with the plurality of electrodes, a first portion of the electrical contact layer being disposed on the first side surface of the substrate and a second portion of the electrical contact layer disposed over the second surface of the dielectric layer;
   an interposer structure coupled to the substrate, wherein the interposer structure includes a continuous annular region defining a recessed region bounded by a bond surface; and
   a transparent cover coupled to the interposer structure and sealing the micro-electromechanical device in the recessed region to isolate the micro-electromechanical device in a controlled environment.

2. The package of claim 1 wherein the micro-electromechanical device comprises an array of micro-mirror devices.

3. The package of claim 2 wherein the array of micro-mirror devices are fabricated on the upper surface of the substrate.

4. The package of claim 1 wherein the thermally conductive structure comprises a thermally conductive epoxy layer and a thermally conductive dielectric layer.

5. The package of claim 1 wherein the electrical contact layer comprises two or more layers of wire traces.

6. The package of claim 1 wherein the interposer structure comprises at least one of glass or silicon.

7. The package of claim 1 wherein the transparent cover comprises a glass layer.

8. The package of claim 1 wherein the bond surface comprises a glass fit material.

9. The package of claim 1 wherein the bond surface comprises a metal material.

10. The package of claim 7 further comprising at least one of an aperture or an antireflective coating coupled to the glass layer.

11. The package of claim 1 further comprising one or more channels providing for fluid communication between an atmosphere associated with the micro-electromechanical device and an external atmosphere.

12. The package of claim 1 wherein the controlled environment comprises a hermetically sealed environment.

* * * * *